United States Patent [19]

MacDowell et al.

[11] Patent Number: 5,439,781
[45] Date of Patent: Aug. 8, 1995

[54] DEVICE FABRICATION ENTAILING SYNCHROTRON RADIATION

[75] Inventors: Alastair A. MacDowell, Baiting Hollow, N.Y.; Donald L. White, Morris Plains, N.J.

[73] Assignee: AT&T Corp., Murray Hill, N.J.

[21] Appl. No.: 59,924

[22] Filed: May 10, 1993

[51] Int. Cl.⁶ .......................... G03C 5/16; G21K 5/00
[52] U.S. Cl. ..................... 430/311; 430/966; 430/967; 250/492.1; 250/492.2; 378/34; 378/35
[58] Field of Search .............. 430/311, 966, 967; 250/492.1, 492.2; 378/34, 35

[56] References Cited

U.S. PATENT DOCUMENTS

| | | | |
|---|---|---|---|
| 5,175,755 | 12/1992 | Kumakhov | 378/34 |
| 5,235,626 | 8/1993 | Flamholz | 378/34 |
| 5,263,073 | 11/1993 | Feldman | 378/34 |

OTHER PUBLICATIONS

R. P. Haelbich, et al., "Synchrotron Radiation X-Ray Lithography", *Nuc. Inst. & Methods*, 222, pp. 291–301 (1984).

R. López-Delgado, et al., "Focusing all the synchrotron radiation($2\pi$ radians) from an electron storage ring on a single point without time distortion", *Optics Communications*, vol. 19, No. 2, pp. 286–291 (1976).

*Primary Examiner*—Kathleen Duda
*Attorney, Agent, or Firm*—George S. Indig

[57] ABSTRACT

Devices built to design rules $\leq 0.25$ $\mu$m are pattern delineated by use of synchrotron-emitted x-ray radiation using a condenser which collects over a collection arc of at least 100 mrad. Condenser designs provide for processing of collected radiation to tailor characteristics such as direction and divergence. Pattern delineation by proximity printing as well as by projection printing is described. Forms of projection printing include reduction ringfield projection as by 5:1 mask:image reduction.

17 Claims, 7 Drawing Sheets

DEVICE FABRICATION ENTAILING SYNCHROTRON RADIATION

BACKGROUND OF THE INVENTION

1. Technical Field

The invention relates to fabrication of devices built to submicron design rules. Synchrotron-derived x-ray radiation serves for pattern delineation for small features considered unattainable by use of longer wavelength electromagnetic radiation. Pattern delineation may be 1:1 as in proximity patterning, or may be reduction as in favored forms of projection patterning. Very Large Scale Integration ("VLSI") is a prime device objective.

2. Description of the Prior Art

State-of-the-art VLSI is a 16 megabit chip with circuitry built to design rules of 0.5 µm. Effort directed to further miniaturization takes the initial form of more fully utilizing resolution capability of presently-used ultraviolet ("UV") delineating radiation. "Deep" UV ($\lambda = 0.3$ µm $- 0.1$ µm), with techniques such as phase masking, off-axis illumination, and step-and-repeat may permit design rules (minimum feature or space dimension) of 0.25 µm or slightly smaller.

At still smaller design rules, a different form of delineating radiation is required to avoid wavelength-related resolution limits. An extensive effort depends on electron or other charged-particle radiation. Use of electromagnetic radiation for this purpose will require x-ray wavelengths.

One approach to x-ray delineation is proximity printing. In this approach, which resembles photographic contact printing, the x-ray mask is placed on top of the wafer. (To protect the fragile, costly, fine-featured mask, it is placed close to but out of contact with the wafer—thus the term "proximity"). The arrangement certainly avoids complex (reflecting) optics required for projection imaging, but is restricted to 1:1, object:image size.

Projection imaging reduces likelihood of mask damage. Reduction capability reduces cost of the now larger-feature mask. A promising version is ringfield projection with object-to-image reduction of perhaps 5:1. Ringfield makes use of an arcuate slit of high aspect ratio with all portions of the slit at constant distance from the optical axis of the lens system to avoid radially-dependent aberrations. See, co-pending U.S. application Ser. No. 07/732,559, filed Jul. 19, 1991.

Advancement in both proximity and projection x-ray lithography have been impressive. A variety of design parameters have been optimized. In proximity printing, techniques have been developed for avoiding mask damage while providing for needed close mask-to-wafer spacing. Step-and-scan is expected to yield acceptable patterns in ringfield projection. Both are believed capable of 0.1 µm resolution in production.

Relatively little attention has been directed to a suitable radiation source. In projection printing it has been generally assumed that a "plasma source" would be used. Such a source depends upon a high power, pulsed laser-e.g. an yttrium aluminum garnet (YAG) laser, or an excimer laser, delivering 500–1000 watts of power to a 10 µm–100 µm spot—thereby heating a source material to e.g. $10^{6°}$ C. to emit x-ray radiation from the resulting plasma. Such a source has many favorable characteristics. It is compact, and may be dedicated to a single production line (so that malfunction does not close down the entire plant). Considerable effort is being directed to development of an x-ray plasma source.

The synchrotron represents a well-developed art for reliable x-ray emission. The synchrotron is, however, very costly, and is generally justifiable only when made available to many users at a time. It has become a fixture at national laboratories and other large institutions, where small emission space, short time rental is made available and serves a variety of sophisticated objectives.

Absent an appropriate plasma source, proximity x-ray printing, the most developed form of x-ray lithography, has used synchrotron emission. Consistent with traditional, highly demanding, scientific usage, proximity printing has been based on the usual small collection arc. Proximity x-ray printing uses its 10–20 mrad synchrotron radiation fan to produce a 1 mm-2 mm$\times$40 mm line-shaped illumination field which scans the 25 mm$\times$25 mm mask field. See Nuc. Inst. & Methods, 222 p. 291 (1984). Many believe that proximity x-ray printing will go into commercial use despite its many limitations—despite unavailability of image reduction; despite need for fragile membrane masks; despite unavailability of full-field imaging.

In projection lithography, a variety of considerations lead to "soft" x-ray illumination ($\lambda = 100$ Å–200 Å). In proximity printing, a shorter wavelength, e.g. 8 Å–16 Å, is necessary to minimize resolution loss due to diffraction at feature edges on the transmission mask. In projection printing, camera optics, between the mask and the wafer, compensate for edge diffraction and permit use of longer wavelength radiation, more favorable for reflective optics. Limitations of the synchrotron source —largely cost—are little-affected by choice of the longer wavelength radiation.

Adaptation of synchrotron radiation to use in projection lithography will have to be addressed. The 1 mm-2 mm high emission fan does not lend itself either to full-field exposure (with its relatively low aspect illumination field), or to the favored ringfield approach (with its arc shaped illumination field which is designed to minimize radially-dependent aberrations—aberrations due to varying distance from the optical center of the lens system).

SUMMARY OF THE INVENTION

Economical high-throughput fabrication of 0.25 µm or smaller design-rule devices is made possible by use of synchrotron-derived x-ray delineating radiation. The advance is, in large part, due to the realization that the traditional, per-customer, small arc collection angle, essential to usual synchrotron study, is inappropriate for contemplated lithographic purposes. Large angle collection—collection over at least 100 mrad to a full radian or greater-while running counter to usual experimental high-precision demands, will be important for device fabrication. This avoids radiation-limited throughput and accommodates lithographically preferred, many-event resists which are not designed for maximum sensitivity.

Condensers for use in the inventive processes efficiently collect large amounts of radiation from a synchrotron and deliver it to a mask. They may process the radiation to provide homogeneity, shaping, and divergence.

Appropriate condenser designs use many-faceted mirror collectors. Processing optics may have faceted or continuous reflecting surfaces.

DEFINITIONS

Synchrotron—Electron storage ring providing for relativistic electrons confined by magnetic fields to a repeating orbital path.

Illuminating Radiation—The delineating radiation as incident on and producing an Illumination Field on the mask, characterized by intensity, direction, divergence and spectral width.

Divergence—As used by itself, the term refers to mask divergence, i.e., the largest angle about the axis of the cone of radiation as incident on the mask. In projection, the axis is generally a few degrees off normal incidence as required for reflection masking. The magnitude of divergence required in projection is that needed to reduce ringing at feature edges to the extent necessary for desired resolution and contrast. In full-field exposure, divergence should be similar at every illumination point. In scanning, some non-uniformity in the scanning direction may be averaged out.

Condenser—Optical system for collecting radiation from the synchrotron, for processing the radiation into a form suitable for lithography, and for illuminating the mask.

Collecting Optics (or Collector)—The Optics within the condenser responsible for collecting the synchrotron radiation. The collector has a focus.

Processing Optics—Any optics, in addition to the collecting optics, within the condenser for processing collected radiation for delivery to the mask.

Imaging Optics—Optics following the condenser responsible for delivering mask-modulated radiation to the wafer, i.e. the camera optics.

Camera Pupil—Real or virtual aperture which defines the position through which illumination radiation must enter the camera, of angular size defining the diffraction limit of the camera. Its physical size is that of an image of the real limiting aperture of the camera.

Lens—The term is used in this description to define any optical element which causes x-ray radiation to converge or diverge. "Lenses", in x-ray systems, are generally reflecting-arc sometimes referred to as "mirrors". Contemplated lenses may be multi-faceted or single-facet (continuous-e.g., of ellipsoidal or other curvature). The convergence or divergence is a result of an action analogous to that of a transmission optical lens.

Facet—Individual segment of a lens—either a separate element, or part of a monolithic structure, which, generally in concert with other facets, is responsible for convergence or divergence of the radiation. Individual facets may be planar or curved.

Scatter Plate—Optical element for increasing divergence. Divergence may be in one or two dimensions.

Full-Field exposure—Simultaneous (rather than sequential) exposure of an area. In its derivation, the term generally refers to a complete circuit pattern such as that of an entire chip. In this description, it is used to refer to any low-aspect ratio rectilinear pattern region, whether of an entire or partial pattern. Contemplated partial patterns may be stitched together by step-and-repeat to constitute the entire pattern.

DETAILED DESCRIPTION

General—The advance makes effective use of x-ray synchrotron radiation, collected over a large emission arc for use in illuminating a pattern mask. The arc is at least 100 mrad, or preferably 200 mrad to a full radian or more. Pattern delineation to which the radiation is to be applied may take a variety of forms. It may take the form of full-field exposure or of a scanning region. Exposure may be by proximity printing, or by projection. A favored form of projection, known as ringfield projection, makes use of a scanning region of arcuate shape, likely with object-to-image reduction, perhaps by a ratio of 5:1, to permit use of more economical, larger-feature, masks.

Figure 1:
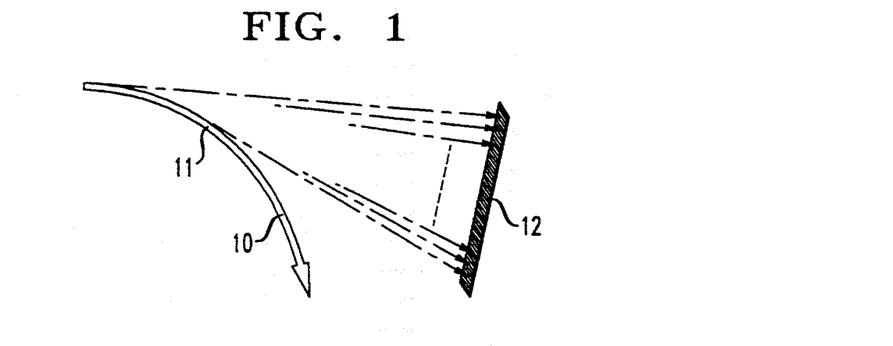
FIG. 1 schematically depicts an electron beam, following its curved synchrotron path, and emitting a fan of x-ray radiation.

Synchrotron radiation is not well adapted to meet either ringfield or full-field needs. Synchrotron radiation is schematically shown in FIG. 1. As the high speed electrons within beam 10 follow a curved path 11 they emit a fan of electromagnetic radiation 12. The photon energy is determined by the electron energy and by the curvature of the electron path. Electron energies of $5 \times 10^8$ ev $- 1 \times 10^9$ ev are useful for x-ray radiation at the 5 Å–150 Å wavelength range of interest (for synchrotron designs in present use). The emitted radiation fan is very thin, perhaps 1 mm thick, spreading to a thickness of a few mm at a distance of several meters from the synchrotron. The angle of the fan is the same as that of the bent emitting path.

The Condenser

The invention provides for collection of a large arc of synchrotron radiation by use of one or more peripherally-placed faceted lens arrays. Illustrative work discussed in detail provides for collection over a full radian (~57°). This two-order-of-magnitude increase in collection angle increases throughput. Specific needs are met by a variety of arrangements. Collected radiation may be reassembled in proximity printing to yield: a scanning slit; or, alternatively, to yield an illumination region of small aspect ratio for full-field patterning. Species of the invention provide for scanning (e.g. ringfield) or full-field projection.

A) The Collector—It is convenient to first discuss the collector element—the element constituted of many mirror facets about the periphery of the synchrotron. It is expected that a least arc of collection will be 100 mrad, likely from 200 mrad to 1.5 rad.

The emission spectrum is broad. It is desirably tailored to meet particular needs. In projection lithography, a wavelength range of $\lambda = 120$ Å–140 Å takes advantage of most efficient reflectivity (of both lenses and mask). In proximity printing, a shorter wavelength in the range of $\lambda = 8$ Å–16 Å is required for resolution, and meets characteristics of available resists. Efficient operation of the condenser-minimization of unwanted heating caused by radiation which is relatively ineffective for resist exposure—is aided by spectral narrowing. An early element in the condenser-conveniently the collector-may use a multi-layer mirror (MLR) for this purpose. Use of an MLR of 20–40 pairs of successive high and low index materials operating in the manner of a distributed Bragg reflector (DBR), effectively filters incoming radiation to narrow spectral output to $\pm 2$ Å. The relatively long wavelength radiation of SXPL permits use of glancing-angle lenses with relatively large angles of incidence. Glancing-angle lenses may inherently produce some spectral narrowing. When operating at or near the critical angle for the desired radiation wavelength, shorter wavelength radiation is not reflected.

A typical ringfield camera pass band, may be $130 \pm 1.3$ Å. This band is determined by present multilayer mirror technology. A reflectivity of 60–65% results from use of 40 successive Mo—Si layer pairs. Soft x-ray is also favored for surface reflection. Angles of incidence of 5°–20° may result in reflectivity of 80–90%.

Condenser optics for use with soft x-ray may depend upon the single elements depicted in the figures. Shorter wavelength, e.g., $\lambda = 10$ Å, may require multiple elements, each operating at a small glancing angle, to, together, yield the larger total angle likely desired for many condenser designs. For convenience, discussion is generally in terms of the single elements. However, even though depicted as single elements, two or more elements may be combined for a given change in beam direction.

Individual facets are generally described as planar. Alternatively, they may be curved—spherical or parabolic—or may take the form of the sophisticated Lopez design which accepts the many-point distributed source of the synchrotron to converge to a single focus. See, Optics Communication, vol. 19 pp. 286–291 (1976).

Collection over a radian for a synchrotron of radius = 1 m–2 m may require a collector length of the order of a meter. This may be accommodated by a lens of 100 or more planar facets of dimensions 10–20 long × a few mm wide. Facets may be discrete or may be portions of one or more monolithic arrays. Multiple arrays—monolithic or made up of many discrete facets—may be designed to accommodate valves for maintaining the high-vacuum required for synchrotron operation. The distance from the collector to the synchrotron orbit is typically 1–3 m. Closer spacing may require submillimeter facets; larger spacing may require collectors of excessive size.

Facets are sequentially positioned about the synchrotron orbit. They may be used in a variety of ways. They may produce a facet-by-facet illumination field. They may produce a line field with "non-sequential" facet illumination. They may produce "stacked" radiation, ultimately to yield a field of reduced aspect ratio. Stacked radiation is convenient for full-field illumination, either in proximity printing; or, as further processed, for projection printing. The Lagrange Invariant requires that the product of convergence angle, $\Theta$, and the corresponding focus dimension equal or exceed the same product at the mask, if a dispersing element (a scatter plate) is to be avoided.

Preference for facet shape depends upon the form of patterning. The Lopez mirror is designed to focus radiation to a small dimension. The small focus may have too little divergence. It's Lagrange invariant may be too small to be easily used in projection printing. It may be the preferred approach for proximity printing, in which the Lagrange invariant should be small—i.e. to permit the beam to be made parallel (i.e., to have the required small divergence). It may be combined with a scatter plate to introduce desired divergence, e.g., for shaping the angular distribution of the radiation along the arcuate center line of the slit used in ringfield projection. The converging nature of the Lopez is useful in providing greater collection angle so that, e.g., 10 Lopez facets may reflect 100 planar facets.

The focus of the collector may correspond with a real aperture, or it may, itself, define a virtual aperture. Adjustability of a real aperture is useful in obtaining desired pupil fill.

B) Processing Optics—A purpose of the processing optics is to match the characteristics of the camera. Characteristically, a projection reduction camera operates with a divergence of 5 mrad–15 mrad. Shape and size of the imaging region, again the responsibility of this part of the illumination system, varies with the camera design.

With efficient design there is no clean line of separation between the collector and the processing optics. To the extent that collector facets are designed to direct, to shape, or otherwise to define the illumination region—to the extent that the collector goes beyond focusing collected radiation—to this extent, the collector itself functions as processing optics. Collector emission of stacked radiation fans has been described. Use of the stacking to produce a low-aspect ratio field is an example of processing by the collector.

Variation in facet tilt angle, as well as use of curved facets. may increase processing capability of the collector. Additional faceting, beyond that needed for defining the focus, may also be used for processing. The collector may increase divergence and may shape the field. In most projection systems, separate processing optics is preferred, if only to avoid undue complexity in collector design. Processing lenses may, again, be faceted, or may have an ellipsoidal or other continuously curved surface.

Figure 6:
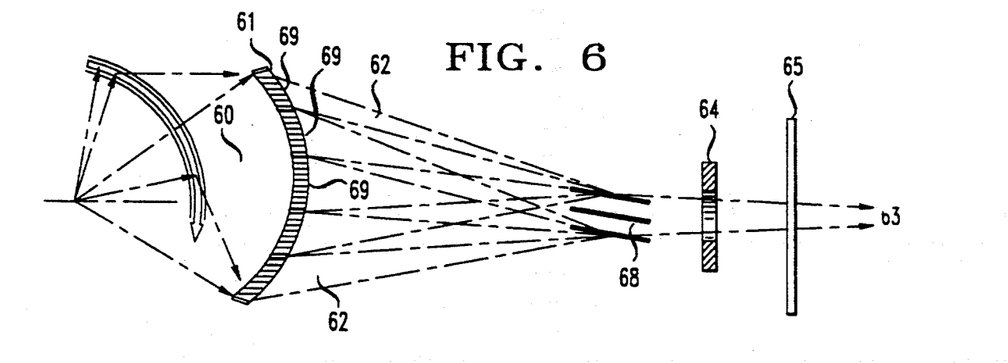
FIG. 6 shows a multi-faceted collection mirror array yielding a stack of beams for full-field proximity imaging.

Minimal processing is required in proximity printing. FIG. 6 illustrates a condenser for use in full-field proximity printing. One processing lens stacks the collected radiation and improves parallelicity.

Co-pending U.S. patent application Ser. No. 07/732,559, filed Jul. 19, 1991 is representative of state-of-the-art ringfield projection printing.

The illumination region must be directed into the entrance pupil of the camera to the proper degree of fill. Fractional filling, e.g. 50% pupil-fill, minimizes edge diffraction and increases contrast.

Figure 2:
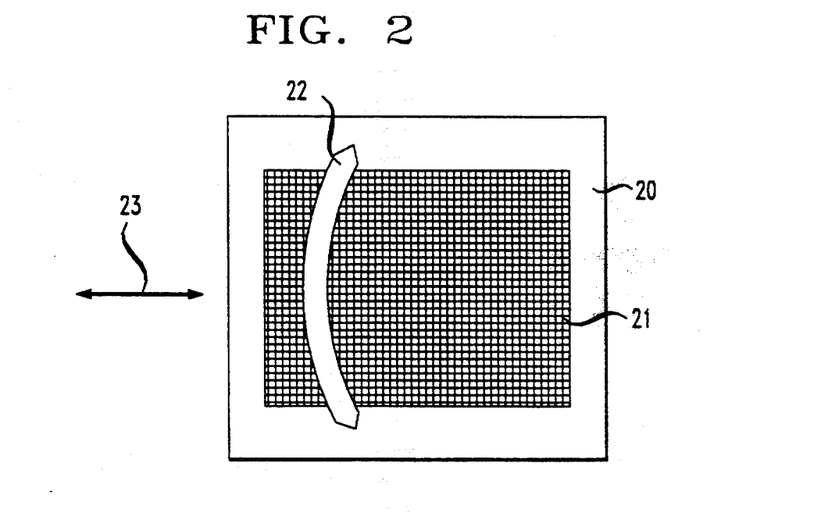
FIG. 2 is a plan view of a projection mask being scanned by the arc-shaped illumination field of a ring-field camera.

The significant case of ringfield projection lithography is represented by FIG. 2. Here, the mask 20 includes a rectilinear patterned region 21, rad region which is being swept horizontally (in direction 23) by an arc-shaped illumination region 22 which may be 2 mm wide×100 mm long. The energy from the condenser must illuminate only region 22 and no other part of region 21. In full-field exposure (as distinguished from the scanning shown) pattern and region 21, must be simultaneously illuminated.

Specific description emphasizes ringfield projection lithography. Where full-field exposure, either proximity or projection, requires different optics, note is made in final discussion in each section.

Figure 3A:
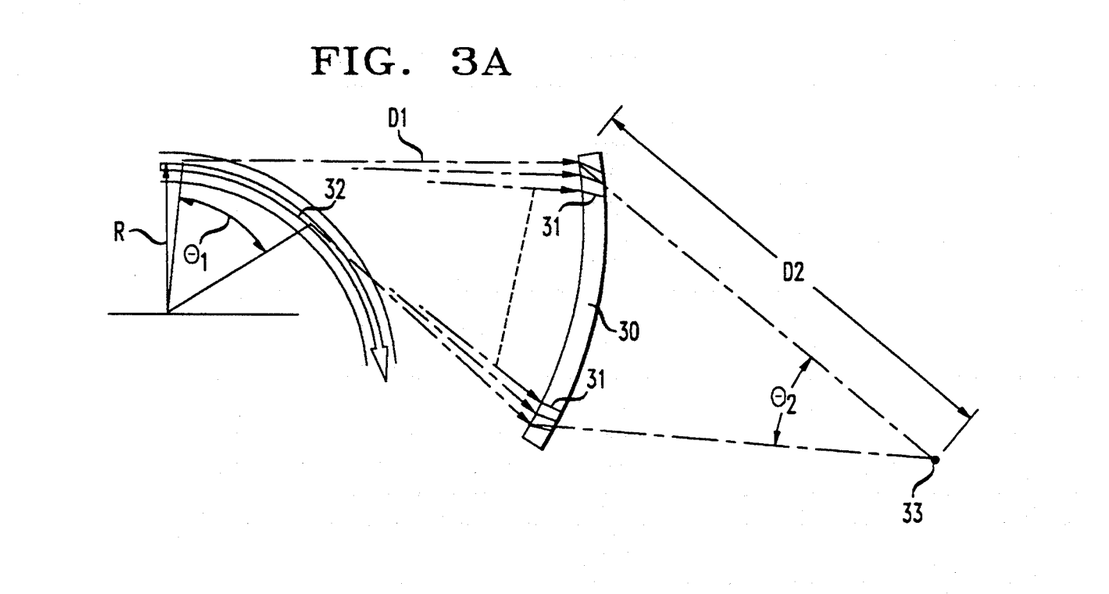
FIGS. 3A and 3B show a multi-faceted mirror, collecting an arc of synchrotron radiation, for delivery to a focus.

FIG. 3A is illustrative in providing for a multi-faceted collector lens 30. Facet 31 may be planar; may be several mm×several cm in size. Each facet receives radiation from a related spot in the orbital path 32, and each directs its reflected ray into focus 33. Faceted lenses contemplated for use in the inventive processes include at least 4 facets. For many purposes—particularly for projection delineation—faceted lenses may contain many more than 4 facets. A preferred structure for ringfield reduction projection may use 40 or more planar facets.

Figure 3B:
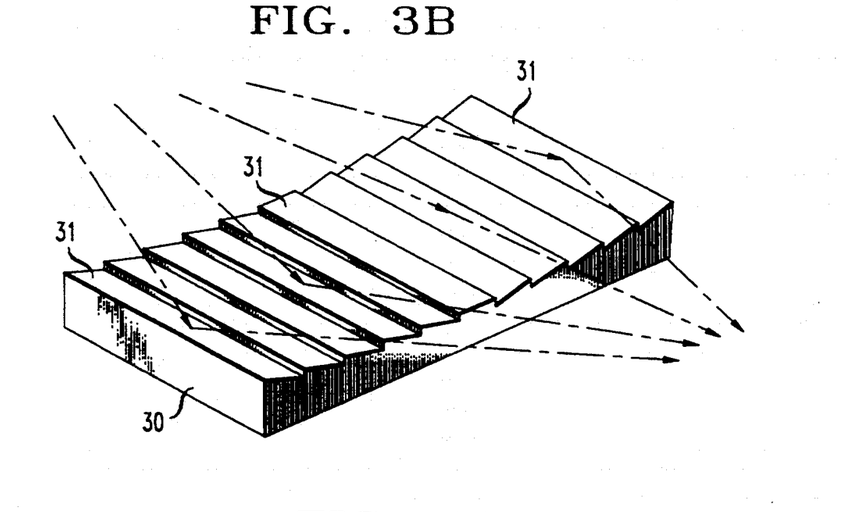

FIG. 3B depicts an illustrative form of lens 30, in this instance, a monolithic body.

Figure 4A:
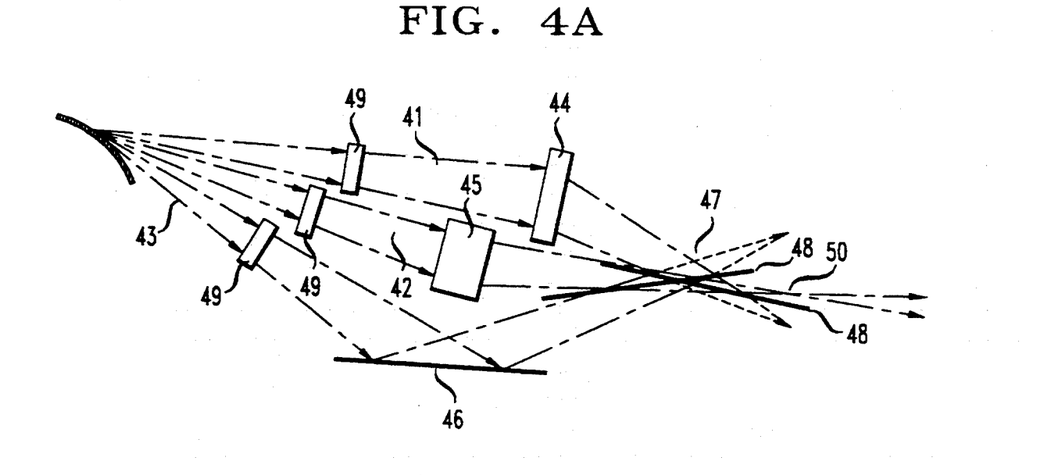
FIGS. 4A and 4B show use of a "stacked collector"—of a collector yielding overlapping parallel radiation fans.
Figure 4B:
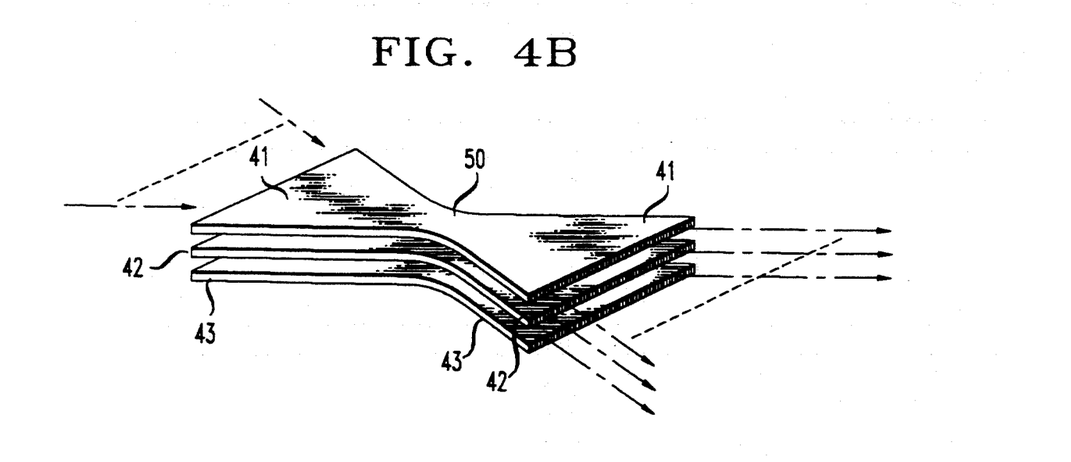

FIGS. 4A and 4B illustrate use of a "stacked" collector. While facets continue to be arranged side-by-side about the storage ring, resulting beams are not side-by-side, but form a vertical stack of parallel fans. Here, three separate beams 41, 42, 43, strike converging collector elements 44, 45, 46 to produce converging beams which overlap in region 47. Elements 44, 45 and 46 as depicted, are arrays of multi-faceted mirrors. In region 47, top and bottom beams 41 and 43 are reflected by long, thin mirrors 48, so that they are made parallel to beam 42. Airtight valves 49 preserve vacuum in the synchrotron.

FIG. 4B is a schematic representation of parallel, overlapping radiation fans as produced at focus 50. Incoming beams 41, 42 and 43 are converging as entering the focus and are diverging when leaving. Divergence may provide for merger to produce an evenly illuminated field on the mask.

Figure 5:
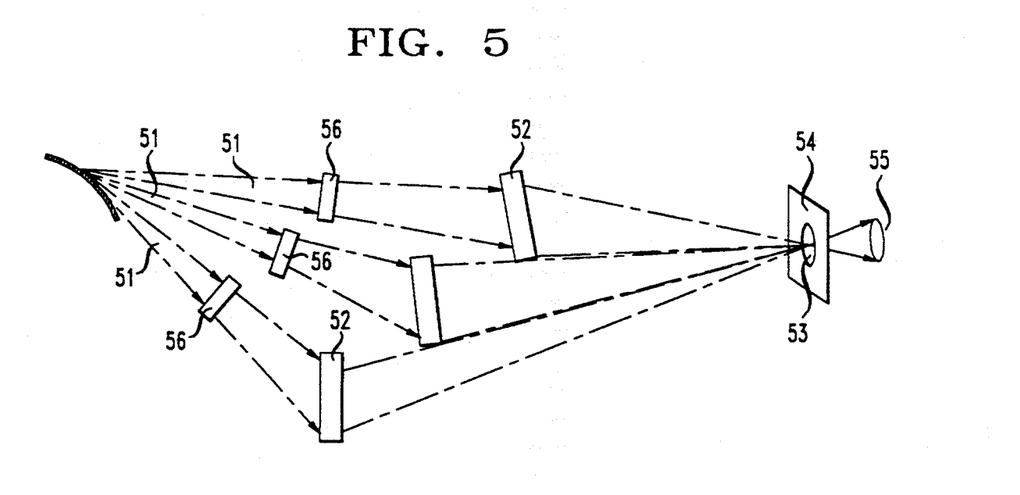
FIG. 5 shows converging optics for processing separated fans of radiation into a horizontally merged illumination fan.

FIG. 5 shows an arrangement for utilization of stacked radiation fans for side-by-side merger. In this figure, emitted rays 51 are collected by converging lens 52 to result in focus 53, within aperture 54, and in horizontal merged fan 55. The figure includes valves 56 for maintaining vacuum.

FIG. 6 shows a condenser designed for full-field proximity printing. As depicted x-ray fan 60 first strikes collector 61 to yield converging beam 62. Converging beam 62 are then assembled into parallel radiation fans by lens elements 68, which in turn illuminate mask 64 to produce a corresponding image on wafer 65. For the arrangement shown, focus 63 is at a position beyond that of mask 64 (and beyond wafer 65 as well). This arrangement provides for the beam parallelicity desired for proximity printing. The distance between mask 64 and elements 68 is such as to assure overlap and constant intensity merger of the radiation fans. While depicted as multi-faceted, arrays 69 constituting collector 61, may be single element, e.g. may be of Lopez or other curved form.

Figure 7:
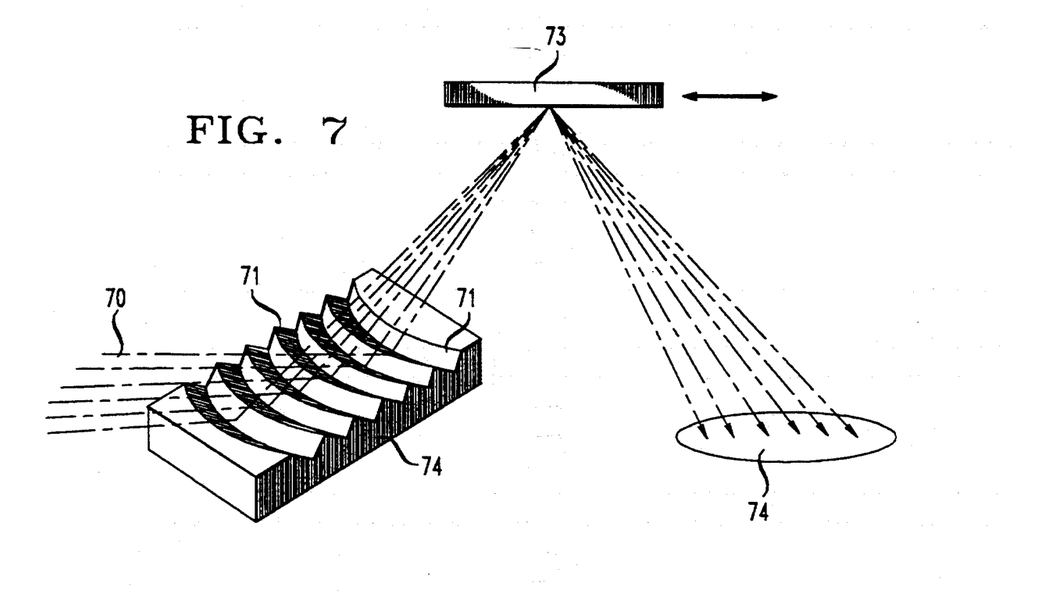
FIG. 7 shows use of a 1-dimensional scatter plate of multi-faceted design.

FIG. 7 shows one form of scatter-plate. Here, the collected beam 70 strikes facets 71 in vertical scatter-plate 72 to illuminate mask 73, and to yield the desired fill at pupil 74. This plate introduces divergence to the vertical component of the beam as viewed by the pupil.

Figure 8:
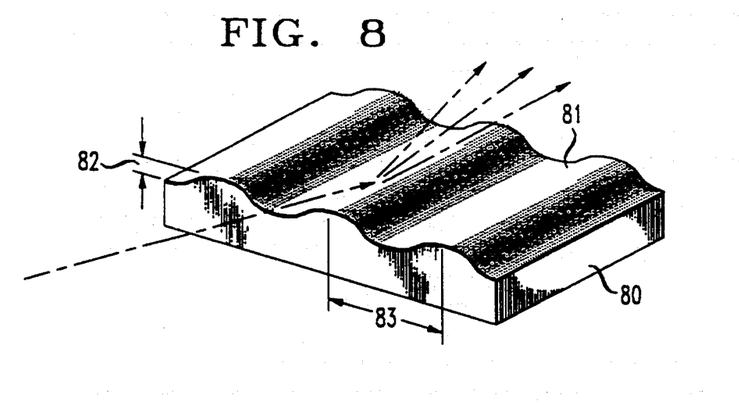
FIG. 8 shows an alternative form of 1-dimensional scatter plate using a sinusoidally undulating surface.

FIG. 8 shows an alternate form of scatter-plate 80. Single-direction scatter is the consequence of undulating surface 81, with specific scatter determined by elevational variation 82 and undulating periodicity 83. This form is especially useful in making radiation in the horizontal fan more divergent, when the Lagrange invariant of the collector is smaller than that of the camera.

Figure 9:
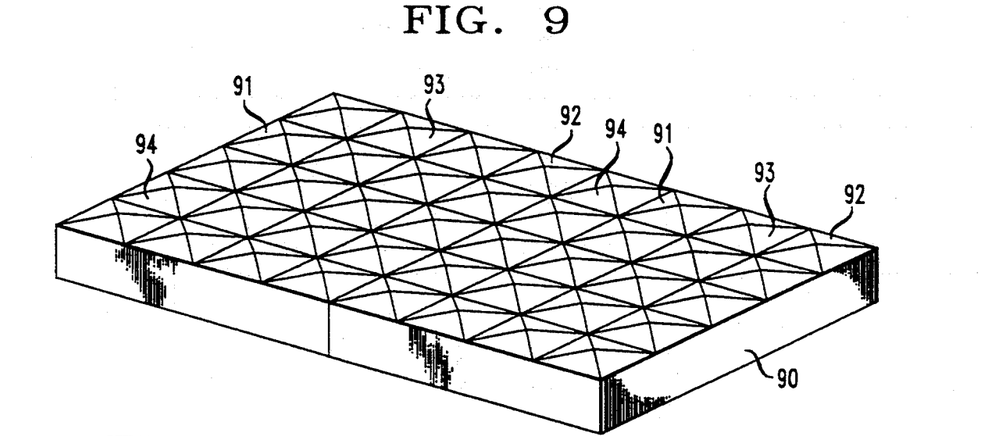
FIG. 9 shows one form of a 2-dimensional scatter plate, depending on reflection from pyramidal surface protrusions.

In FIG. 9, lens 90 serves as a two-dimensional scatter plate. When constituted of pyramid planar surfaces 91, 92, 93 and 94 it may perform as a phase-plate which is analogous to the quadripole (or quadrature) diffraction plate described for use in UV step-and-repeat patterning in co-pending U.S. application Ser. No. 08/029,749, filed Mar. 11, 1993. Incoming collimated radiation is redirected by pyramidal surfaces 91, 92, 93 and 94. Other reflector shapes providing for various forms of radiation are described in this co-pending application.

Figure 10:
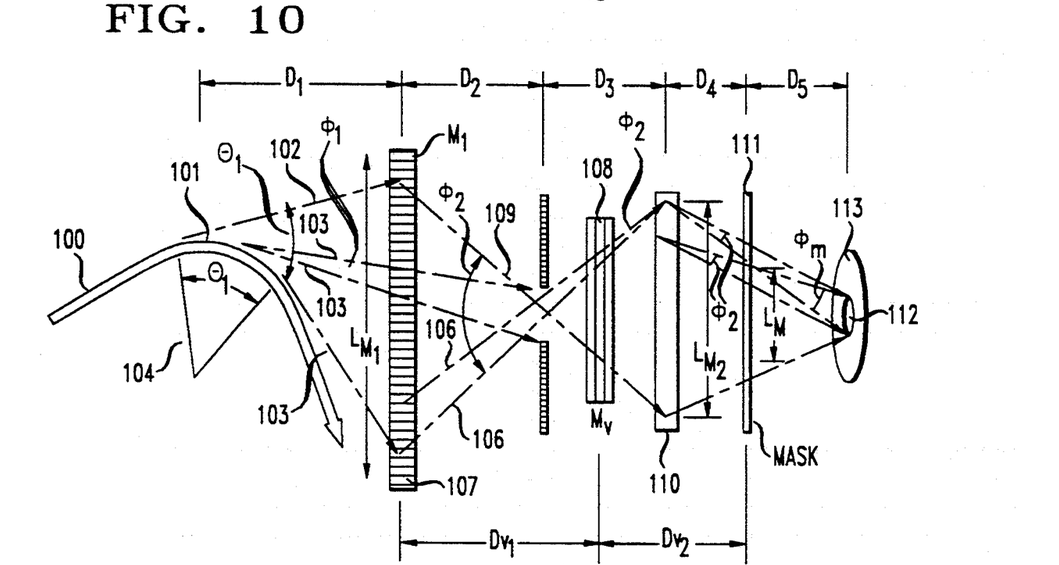
FIG. 10 is a schematic view of a condenser, provided with a collector, a real aperture and a scatter plate, for illuminating a projection mask.

FIG. 10 is a schematic plan view of a complete condenser. E-beam 100, in following curved path 101, emits a fan of radiation 102, considered as the composite of rays 103 produced by point sources within arc 104. The fan of radiation is collected by collector 105 which produces converging rays 107a corresponding with facets 107. The fan of rays 107a is shaped by aperture plate 107; vertical divergence is introduced at scatter-plate 108; radiation 109 is focused by ellipsoidal mirror 110; to irradiate mask 111; and finally to produce the desired fill 112 within camera pupil 113. Mirror 110 may be multi-faceted or continuous.

EXAMPLE 1

Parameters for a ringfield condenser are discussed on the basis of FIG. 10. The mask is viewed as being illuminated in the horizontal plane by a multiplicity of sources from along the stripe of illumination on the surface of processing mirror 110. Each point on the mirror has light reflecting from it with a range of angles $\Phi_2$ which overlap on the mask, with the effect that every point on the mask has light reflecting from it with a range of angles $\Phi_m$, directed at, and partially filling the camera entrance pupil. $\Phi_m$ is defined by the camera as $2\sigma$ NA=where NA is the numerical aperture of the camera on the mask side and $\sigma$=the fraction of the pupil filled with radiation from the condenser. A typical value for $\Phi_m$ is 25 mrad. $D_5$ is defined by the camera to be 3644 mm and $D_4$ is set at 500 mm. Substituting in the equation: $\Phi_2 = \Phi_m \cdot D_5/(D_4+D_5)$, $\Phi_2 \approx 22$ mrad. Excess illumination beyond the ends of the illuminated mask length $L_m$ as shown in FIG. 10 assures uniform illumination over the mask. The horizontal illuminated length ($L_M$) of mirror 110 is set by the geometric relation $L_M = L_m \cdot ((D_5+D_4)/D_5) + (2 \cdot D_4 \cdot \Phi_m))$, where $L_m$ is the chord length of the arc illuminating the mask as set by the camera to be 100 mm. This defines $L_M = 139$ mm. With $D_1 = 1000$ mm, $D_2 = 5000$ mm and $S_1 = 25$ mm, the distance, $D_3 = S_1/\Phi_2 = 1136$ mm. This in turn determines $\Theta_2 = L_M/D_3 = 0.12$ radians. Accordingly, $L_{M1} = \Theta_2 \times D_2 = 600$ mm, which is the horizontal width of the collection mirror as seen by the mask. A point on the mask looking back towards the source will see a projected horizontal section of the mirror $M_1$ of length $\Theta_m \cdot (D_2 + D_3 + D_4) = 130$ mm. Each facet on mirror $M_1$ appears when looking backwards from the mask to have a horizontal width $W_{M1} = S_1(D_1(D_1 + D_2)) = 4.2$ mm wide. Thus, each point on the mask is illuminated by $L_{M1}/W_{M1} = 166/4.2 = 39$ points of radiation which is sufficient for the condenser to act as if it were a continuous distribution of radiation. The total number of facets that make up mirror $M_1$ is thus $600/4.2 = 142$ facets. Any more than this and the light would not be captured by the mask. To capture 1 radian of radiation from the synchrotron, the facets must be 2.8 mm wide and $D_2 = 8000$ mm.

In the vertical plane the faceted mirror $M_v$ is located at a distance $D_1 + D_{v1}$ from the source. The vertical height of the beam at $M_v$ is therefore $(D_1 + D_{v2}) \cdot \Phi_v$ mm, where $\Phi_v$ is the vertical opening angle of the radiation which is $\pm 1$ mrad. To fill the pupil to the required $\sigma$ value the beam height on mirror $M_v$ is also required to equal $D_{v2} \cdot \Phi_m$. Since $D_{v1} + D_{v2} = D_2 + D_3 + D_4$, $D_{v1} = 6035$ mm, $D_{v2} = 601$ mm.

Computed values in the Example above are based on small angle approximation (sin $\Phi = \Phi$). The example illustrates condenser design to match a particular camera.

Figure 11A:
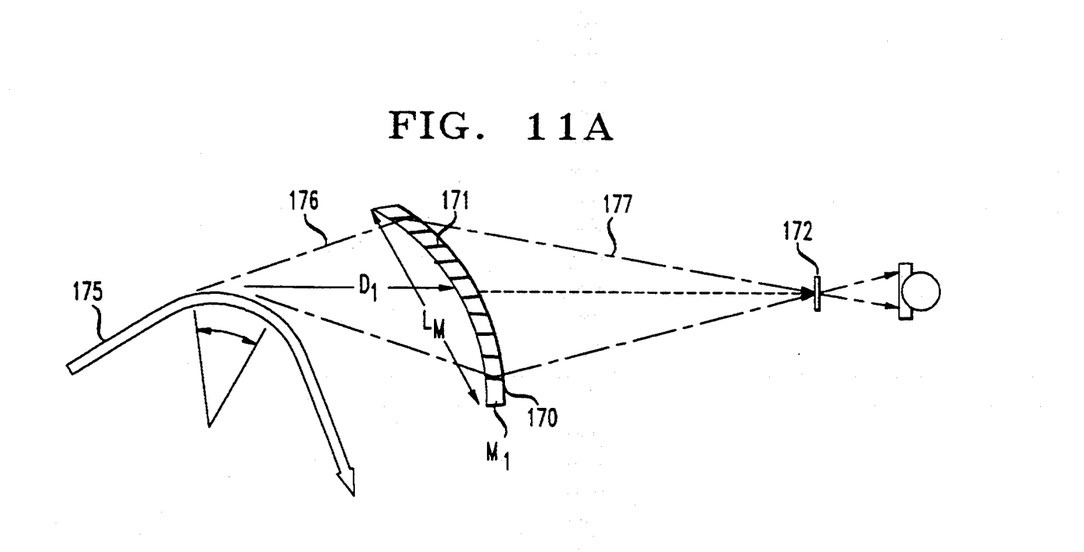
FIGS. 11A, 11B and 11C are schematic views of the condenser of FIG. 10.
Figure 11B:
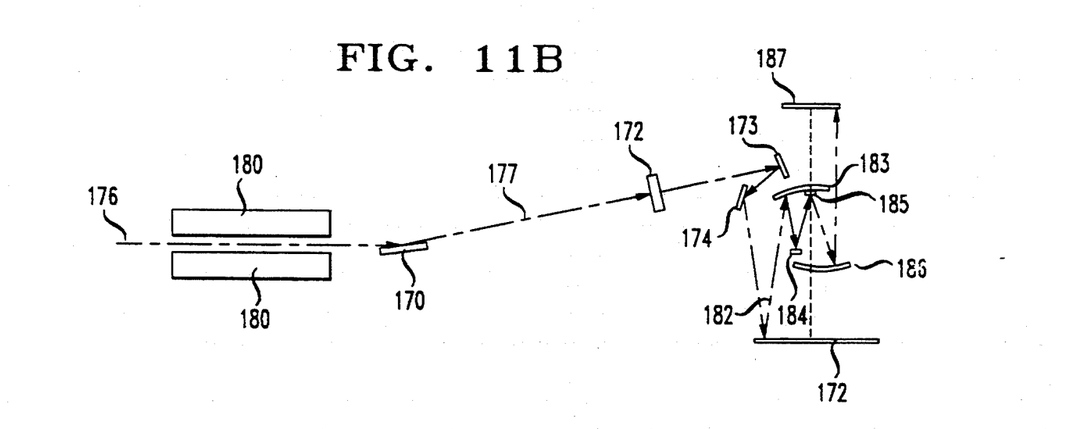
Figure 11C:
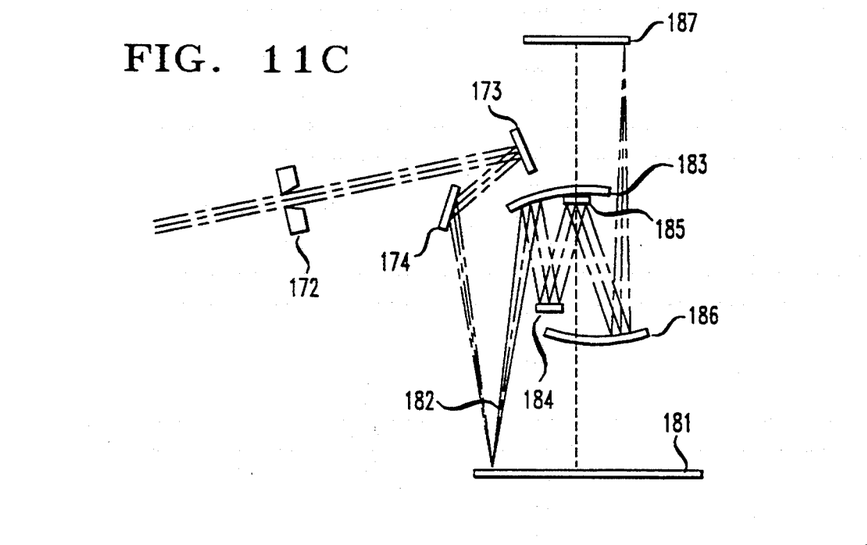

FIGS. 11A, 11B and 11C are plan, elevation, and detailed views of the condenser described above. The length of the faceted collection mirror 170 ($M_1$) is the result of projection of distance $L_M$ onto a circle of radius 1743 mm, to result in $D_1 = 1000$ mm for an electron orbit radius of 1429 mm. For the layout shown in FIG. 11A, the length of mirror 170(mirror $M_1$) is 1061 mm, the width of each facet 171 is 7.5 mm (the width dimension of the out-of-plane facet surface is not shown in the 2-dimensional representation of this figure) and the entire mirror collects 0.6 radians. Each facet is required to be adjustable and is located close to the electron beam. The facets of mirror 170 ($M_1$) reflect the beam upwards with a 10° reflection angle, and direct the light through the aperture 172 (aperture $S_1$). Beyond $S_1$ is the faceted mirror 173 (mirror $M_v$) which is located 7035 mm distant from the source. Mirror $M_v$ reflects the beam downwards through about 135° onto mirror 174 (mirror $M_2$). Mirror $M_v$ is made up of MLR facets to accommodate the large angle of incidence. The vertical beam height at mirror $M_v$ is approximately 14 mm, and this may be reduced to a minimum of 2 mm at the mask. Mirror $M_v$ may consist of 10 facets, each 1.4 mm in width, to create an illumination field on the mask of width 1.4 mm with some penumbral blurring on each. These 10 points of illumination on the vertical plane are somewhat less than the 39 illumination points in the horizontal plane, but in scanning the mask through the imaging field, there is an adequate amount of averaging for homogeneous illumination. The mirror $M_2$ is ellipsoidal to satisfy the large incoming beam and substantial off-axis imaging requirements. A suitable ellipsoid shape has an eccentricity of 0.96, a directrix of 2718 mm and a grazing angle of 20 degrees. With this ellipsoidal shape and the noted distances, the mask is illuminated with approximately the correct are shape of illumination for ringfield delineation. The throughput efficiency of this second illuminator arrangement is approximately 32% which is a little higher than the earlier illuminator example due to the smaller grazing angle on mirror $M_1$.

FIGS. 11B and 11C depict elements not clearly seen in FIG. 11A. The electron orbital path 175 as seen on FIG. 11A is determined by bending magnets 180 to result in x-ray irradiation 176. After deflection by mirror 170, this now-converging radiation 177 passes through aperture 172 to have its path determined by mirrors 173 and 174 ($M_v$ and $M_2$, respectively). Thereafter, mask 181 is irradiated to produce beam 182. Camera optics include (in succession as viewed by incoming beam 182) mirrors 183, 184, 185 and 186). (For detailed description, see co-pending U.S. application Ser. No. 07/732,559, filed Jul. 19, 1991). Finally, the reduced image is produced on wafer 187.

EXAMPLE 2

Figure 12:
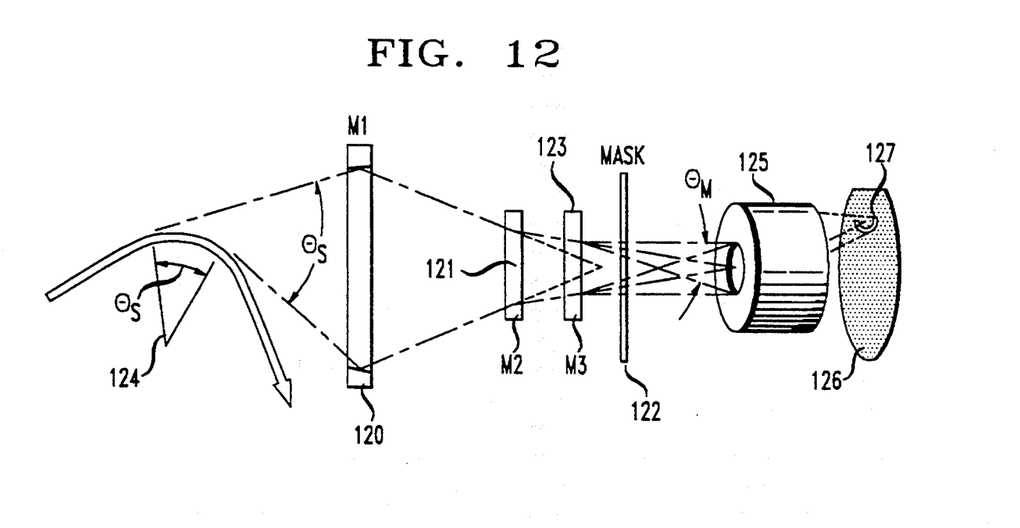
FIG. 12 is a schematic view of a condenser of design alternative to that of FIGS. 10 and 11.

FIG. 12 is discussed as a second example of collection and processing. The apparatus of this figure includes a condenser of design alternative to that of FIG. 10. Discussion is in terms of ringfield projection delineation.

Here, multi-faceted mirror 120 ($M_1$) collects about 500 mrad of x-ray radiation and directs it at ellipsoidal mirror 121($M_2$). Mirror $M_2$ focuses the radiation through the mask to form a focus at the center of the camera pupil. $M_2$ also shapes the beam into the arc shape for illuminating the reflection mask. 122 Scatter plate 123($M_3$) located between $M_2$ and the mask consists of a mirror with a rippled sinusoidal surface (see FIG. 8). Radiation reflecting from $M_3$ has its divergence increased such that it fills the camera entrance pupil to the required $\sigma$ in the horizontal plane. The pupil filling factor is thus determined by the sinusoidal profile of the $M_3$ scatter plate. The scatter plate is essentially a long period grating (e.g. 360° in 1 mm), and may be fabricated using existing grating technology. The grating pitch is large compared to the wavelength of the light used, so consequently there are no detrimental diffraction effects. In the vertical plane, the radiation is tightly collimated from the storage ring. 124 The vertical divergence of the radiation is also increased by the scatter plate 123, this time with a sinusoidal rippled surface normal to the rippled surface scattering the radiation in the horizontal plane. Scatter plate 123 thus has a dimpled surface, the detailed shape of which determines how the pupil 125 is filled.

Figure 13:
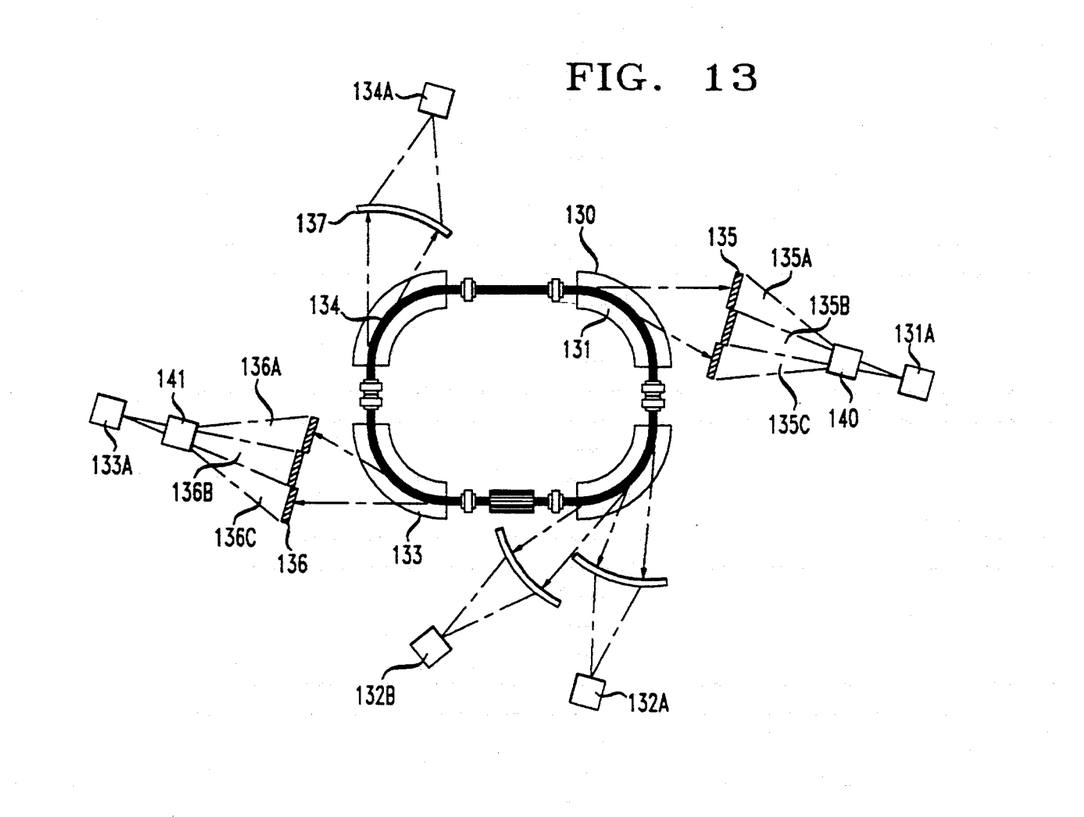
FIG. 13 shows a synchrotron serving five device fabrication lines.

FIG. 13 is a plan view showing a synchrotron serving five fabrication lines. Variations from line to line are intended to show alternative condenser designs. In real apparatus, it is likely that all lines served will be of the same general design.

The figure shows a synchrotron 130 with curved path regions 131, 132, 133, 134, each defining a radius of curvature of 1.5 m. Regions 131, 133 and 134 are served by collectors 135, 136 and 137, each collecting a full radian of radiation. Collectors 135 and 136 are illustrated as consisting of faceted arrays (135A, 135B and 135C in the instance of array 135). Collector 137 is a single curved faceted array. Section 132 is showed as serving two production lines 132a and 132b each utilizing approximately 0.5 rad. In the instances of collectors 135 and 136 merging of radiation yielded by each of the individual arrays is accomplished by processing lenses 140 and 141, respectively.

Figure 14A:
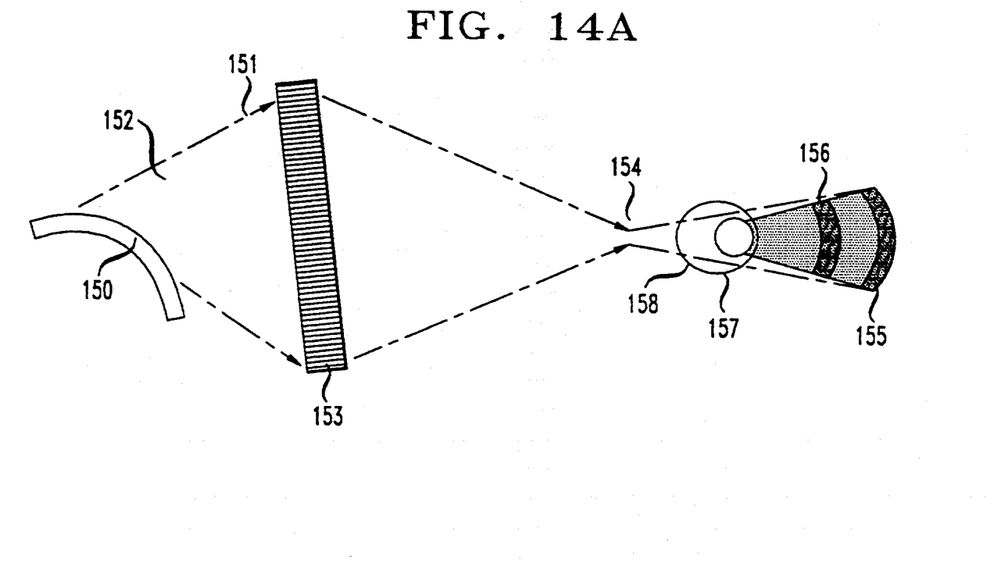
FIGS. 14A and 14B are plan and elevational schematic representations of apparatus suitable for ringfield reduction projection.
Figure 14B:
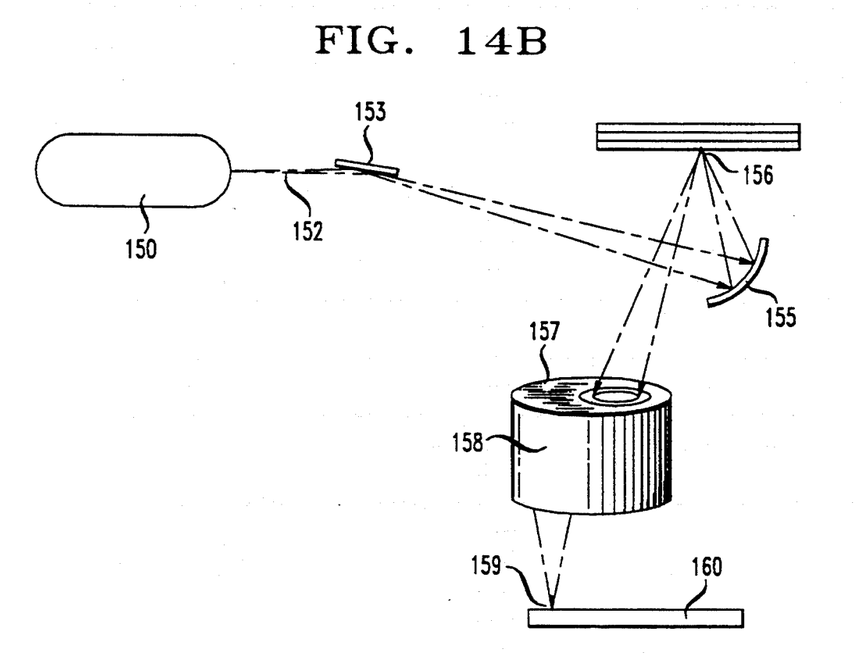

The apparatus of FIGS. 14A and 14B depict a synchrotron electron orbit 150, emitting rays 151, to produce a fan of radiation 152 which in turn is collected by multi-faceted mirror lens 153. The lens brings radiation to focus on the horizontal plane at 154. As viewed on FIG. 14B, the beam continues to diverge on the vertical plane, to be focused on that dimension only by lens 155 which, similar to the apparatus of FIG. 7, has a vertical focus at or near to mask 156. At the same time, mirror 155 shapes the illumination field to the arcuate form 156. Lens 155, conveniently multi-faceted, functions both to focus radiation on or near the mask in the vertical plane, and to focus radiation in the horizontal plane with focus at the camera pupil 157 of camera 158. Camera 158 then produces the mask image 159 on wafer 160.

DEVICE FABRICATION

Description has been in terms of effective utilization of a synchrotron source. Use of x-ray radiation for device fabrication is well understood. Basic fabrication is unchanged by use of the described condenser designs. An excellent fundamental reference, describing a variety of many-level integrated circuits is Simon Sze, VLSI Technology, McGraw Hill 1983. The inventive procedures may be used for all levels, or may be used in conjunction with more traditional forms of lithography for less demanding levels. The critical window level in MOS, VLSI fabrication is chosen for Example 3.

EXAMPLE 3

Discussion is in terms of 0.1 μm design rule VLSI. A work station (production line) such as 133A in FIG. 13 might typically collect 65° of radiation (1.13 rad) from a 600 Mev synchrotron with a current of 700 ma. Such a fan of radiation contains 4 watts of power in the 2.5% band width 134 Å±1.7 Å, of a quality SXPL projection camera. The condenser consisting of one multilayer mirror with reflectivity of 60% and 2 grazing incidence mirrors of reflectivity of 85% and some additional loss due to geometric effects, delivers 40% of the power, i.e. 1.6 watts of usable x-rays, to the mask. Due to losses in the reflectivity of multilayers and filters, the camera delivers 7% of this power, or 112 milliwatts to the wafer. The wafer is coated with a resist that has a sensitivity of 20 millijoules/cm$^2$, resulting in an exposure of about 5.5 cm$^2$ of silicon waver per second. The silicon wafers are 8 inches in diameter, with almost 300 cm$^2$ of usable area. Thus the time spent of exposure of a wafer is 55 seconds. However due to 45 seconds per wafer overhead, consumed in positioning the wafer beneath the apparatus, the work station is capable of exposing only 40 eight inch wafers per hour. Because of periodic shutdowns to refill the storage ring with electrons, the average is reduced to 35 wafers per hour.

The processing of the wafer consists of many processing steps for fabrication of levels involving film deposition and growth, diffusion, ion implantation and various wet and dry etches, as well as the lithography performed by the x-ray projection camera. A critical step is the generation of contact windows. Typically, today, the process consists of 1) growth of 0.1 microns of thermal oxide, 2) deposition of 0.35 microns of oxide by LPCVD (Low Pressure Chemical Vapor Deposition), 3) coating the waver with resist, 4) exposure of the resist to the delineating radiation of the lithographic camera which produces a latent image of the contact window pattern in the resist, 5) development of the resist by chemical means, thus exposing the oxide below the resist, 6) etching through the oxide to the underlying silicon by dry etching, and 7) later depositing metal to contact the silicon and forming the metal, usually aluminum, into strips that connect the many contact holes, gates, external pads, etc. together to form a circuit.

What is claimed is:

1. Process for fabrication of a device comprising at least one element having a dimension $\leq 0.25$ μm, such process comprising construction of a plurality of successive levels, construction of each level comprising lithographic delineation, in accordance with which a subject mask pattern is illuminated to produce a corresponding pattern image on the device being fabricated, ultimately to result in removal of or addition of material in the pattern image regions, in which illumination used in fabrication of at least one level is radiation in the x-ray spectrum, and in which such radiation is derived from synchrotron emission from an electron storage ring Characterized in that
   the illumination consists of radiation from the ring collected over an arc of at least 100 mrad by a condenser, in which the condenser comprises a multi-faceted collector lens containing at least 4 facets, and in which collected radiation is processed subsequent to the collector lens by optics including processing optics.

2. Process of claim 1 in which synchrotron emission is collected over an arc of at least 200 mrad.

3. Process of claim 2 in which synchrotron emission is collected over an arc of at least 0.5 rad.

4. Process of claim 2 in which delineation is by proximity printing and in which radiation delivered by the condenser is in the wavelength range of $\lambda = 8$ Å–16 Å.

5. Process of claim 4 in which the facets are non-planar.

6. Process of claim 5 in which facets are Lopez mirrors.

7. Process of claim 1 in which lithographic delineation is by projection, and in which collected radiation is processed to accommodate imaging optics of a projection camera.

8. Process of claim 7 in which projection comprises ringfield scanning comprising illumination of an arcuate region of a projection mask.

9. Process of claim 8 in which projection comprises reduction ringfield scanning in accordance with which an imaged arcuate region on the image plane is of reduced size relative to that of the subject arcuate region so that the imaged pattern is reduced in size relative to the mask pattern.

10. Process of claim 9 in which processing optics includes at least one scatter plate for increasing divergence of radiation at the image plane.

11. Process of claim 10 in which the scatter plate is multi-faceted.

12. Process of claim 9 in which the collector lens consists essentially of planar facets.

13. Process of claim 9 in which the condenser includes at least one multi-level mirror constituting a distributed reflector.

14. Process of claim 9 in which radiation delivered by the condenser is in the wavelength range of $\lambda = 120$ Å–140 Å.

15. Process of claim 7 in which the condenser focuses radiation on a focus.

16. Process of claim 15 in which the focus corresponds in shape with that of an instantaneous image on the image plane.

17. Process of claim 15 in which the focus corresponds with a real aperture.

* * * * *